US010062681B2

(12) United States Patent
Solaro et al.

(10) Patent No.: US 10,062,681 B2
(45) Date of Patent: Aug. 28, 2018

(54) SOI INTEGRATED CIRCUIT EQUIPPED WITH A DEVICE FOR PROTECTING AGAINST ELECTROSTATIC DISCHARGES

(71) Applicants: Commissariat à l'énergie atomique et aux énergies alternatives, Paris (FR); STMicroelectronics SA, Mountrouge (FR); Centre National de la Recherche Scientifique, Paris (FR)

(72) Inventors: Yohann Solaro, Grenoble (FR); Sorin Cristoloveanu, Seyssinet Pariset (FR); Claire Fenouillet-Beranger, Voiron (FR); Pascal Fonteneau, Theys (FR)

(73) Assignees: Commissariat à l'énergie atomique et aux énergies alternatives, Paris (FR); STMicroelectronics SA, Montrouge (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 15/591,565

(22) Filed: May 10, 2017

(65) Prior Publication Data

US 2017/0256531 A1 Sep. 7, 2017

Related U.S. Application Data

(63) Continuation of application No. 14/450,597, filed on Aug. 4, 2014, now Pat. No. 9,666,577.

(30) Foreign Application Priority Data

Aug. 5, 2013 (FR) ...................................... 1357769

(51) Int. Cl.
*H01L 27/02* (2006.01)
*H01L 29/78* (2006.01)
(Continued)

(52) U.S. Cl.
CPC ...... *H01L 27/0262* (2013.01); *H01L 27/1203* (2013.01); *H01L 29/1012* (2013.01);
(Continued)

(58) Field of Classification Search
CPC . H01L 27/0262; H01L 29/7833; H01L 29/78; H01L 29/7436; H01L 27/1203;
(Continued)

(56) References Cited

U.S. PATENT DOCUMENTS 6,075,899 A 6/2000 Voldman
7,298,008 B2 11/2007 Gauthier
(Continued)

FOREIGN PATENT DOCUMENTS

DE 102006022105 11/2007

OTHER PUBLICATIONS

Noel et al., "UT2B-FDSOI Device Architecture Dedicated to Low Power Design Techniques," 2010 Proceedings of the European Solid-State Device Research Conference (ESSDERC) (2010).

*Primary Examiner* — Latanya N Crawford
(74) *Attorney, Agent, or Firm* — Occhiuti & Rohlicek LLP (57) ABSTRACT

A protection device for protecting an IC against electrostatic discharge includes a buried insulant layer having a thickness that is no greater than fifty nanometers with bipolar transistors arranged thereon, one of which is NPN and the other of which is PNP. A base of one merges with a collector of the other. The transistors selectively conduct a discharge current between electrodes. A first semiconductor ground plane under the buried insulant layer is capable of being electrically biased and extends underneath the base of the first bipolar transistor. The ground plane and a base of one transistor have the same doping. However, its dopant density is at least tenfold greater than that of the base.

18 Claims, 9 Drawing Sheets

(51) Int. Cl.
*H01L 29/74* (2006.01)
*H01L 29/749* (2006.01)
*H01L 29/747* (2006.01)
*H01L 29/66* (2006.01)
*H01L 29/423* (2006.01)
*H01L 29/10* (2006.01)
*H01L 27/12* (2006.01)

(52) U.S. Cl.
CPC .. *H01L 29/42308* (2013.01); *H01L 29/66477* (2013.01); *H01L 29/747* (2013.01); *H01L 29/749* (2013.01); *H01L 29/7436* (2013.01); *H01L 29/78* (2013.01); *H01L 29/7833* (2013.01)

(58) Field of Classification Search
CPC ............ H01L 29/747; H01L 29/66477; H01L 29/42308; H01L 29/1012; H01L 29/749; H01L 23/60; H01L 29/1008
See application file for complete search history.

(56) References Cited

U.S. PATENT DOCUMENTS

| | | |
|---|---|---|
| 7,316,941 B1 | 1/2008 | Gupta |
| 7,573,077 B1 | 8/2009 | Ershov |
| 7,791,102 B2 | 9/2010 | Salman et al. |
| 7,791,139 B2 | 9/2010 | Wahl |
| 8,455,949 B2 | 6/2013 | Gossner |
| 2003/0007301 A1 | 1/2003 | Ker et al. |
| 2005/0212051 A1 | 9/2005 | Jozwiak et al. |
| 2007/0170512 A1 | 7/2007 | Gauthier, Jr. |
| 2007/0262386 A1 | 11/2007 | Gossner |
| 2009/0026542 A1 | 1/2009 | Wahl |
| 2009/0309129 A1 | 12/2009 | Domanski |
| 2010/0230719 A1 | 9/2010 | Sawahata |
| 2012/0187525 A1 | 7/2012 | Abou-Khalil |
| 2013/0134477 A1 | 5/2013 | Gauthier, Jr. |
| 2013/0285111 A1 | 10/2013 | Di Sarro |

SOI INTEGRATED CIRCUIT EQUIPPED WITH A DEVICE FOR PROTECTING AGAINST ELECTROSTATIC DISCHARGES

RELATED APPLICATIONS

This application is a continuation of and claims the benefit of the Aug. 4, 2014 filing date of U.S. application Ser. No. 14/450,597, which claims the benefit of the Aug. 5, 2013 priority date of French application FR 1357769, the contents of which are herein incorporated by reference in their entirety.

FIELD OF INVENTION

The invention relates to integrated circuits, and in particular to integrated circuits produced on a substrate of silicon-on-insulator (SOI) type.

BACKGROUND

Integrated circuits produced by SOI technology exhibit a certain number of advantages. Such circuits generally exhibit lower electrical consumption for equivalent performance. Such circuits generally induce lower parasitical capacitances, which make it possible to improve the switching speed. Moreover, the phenomenon of parasitic triggering ("latch-up") encountered by MOS transistors in Bulk technology can be avoided. Such circuits therefore turn out to be particularly suitable for applications of SoC or MEMS type. It is also noted that SOI integrated circuits are less sensitive to the effects of ionizing radiation and therefore turn out to be more reliable in applications where such radiation may induce operational problems, in particular in space applications. SOI integrated circuits can be used for random-access memories of SRAM type or logic gates.

In a known manner, such integrated circuits also include devices for protecting against accidental electrostatic discharges (ESD) that can impair these transistors.

Figure 1:
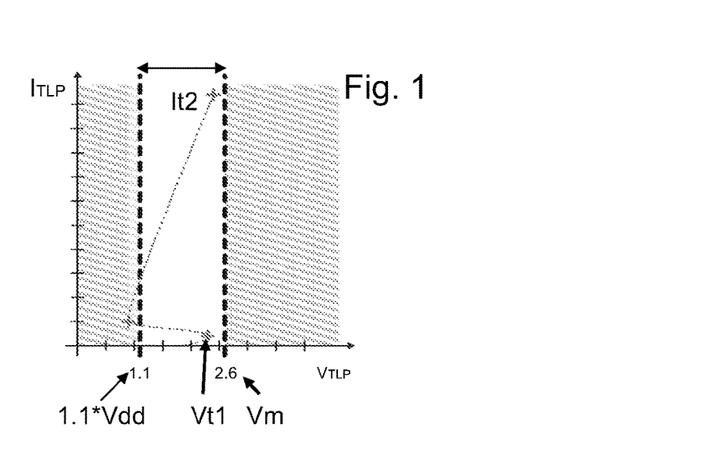
FIG. 1 is an example of a current-voltage diagram of an electrostatic discharge device of the prior art during a discharge.

An ESD device observes certain technological restrictions. FIG. 1 is an example of a current-voltage diagram of an ESD device during a discharge. Upon the appearance of an electrostatic discharge, the voltage across the terminals of the ESD device first increases to a trigger voltage $V_{t1}$. The current passing through the ESD device therefore increases slightly (low leakage). This voltage $V_{t1}$ must remain below a voltage $V_m$, corresponding to a breakdown voltage in MOS technology, typically of 2.6 V for FDSOI with a technological node of 28 nm. The voltage $V_{t1}$ is also greater than a supply voltage $V_{dd}$ of the various circuits in order to avoid accidental triggering of the ESD device. The voltage $V_{t1}$ is thus typically above a voltage of $1.1 \cdot V_{dd}$.

When the triggering voltage $V_{t1}$ is reached, the ESD device is triggered. Firstly, the voltage across the terminals of the ESD device can decrease while the current passing through it continues to rise. Secondly, the voltage across the terminals of the ESD device increases, in the same way as the current passing through it in order to short-circuit the electrostatic discharge current. In this second step, the ESD device must have as low an on-resistance as possible, in order to exhibit as high a maximum short-circuit current $I_{t2}$ as possible for a voltage below the voltage $V_m$.

Moreover, the ESD device must generally have as low a leakage current as possible before being triggered. This reduces the electrical consumption of the integrated circuit.

ESD devices often occupy a non-negligible surface region of the integrated circuit, which it is desirable to minimize.

Moreover, the fabrication process of an ESD device must entail a minimum of additional steps to avoid excessively increasing the cost of the integrated circuit.

SUMMARY OF INVENTION

In one aspect, the invention features an integrated circuit comprising a device for protecting against electrostatic discharges. Such a device includes a buried insulant layer having a thickness less than or equal to 50 nm; first and second bipolar transistors arranged on the buried insulant layer, one of which is an npn transistor and the other of which is a pnp transistor, the base of the first bipolar transistor being merged with the collector of the second bipolar transistor and the base of the second bipolar transistor being merged with the collector of the first bipolar transistor, the first and second bipolar transistors being configured for selectively conducting a discharge current between two electrodes of the protection device; a first semiconductor ground plane arranged under the buried insulant layer, suitable for being electrically biased, extending plumb with the base of the first bipolar transistor, having a first type of doping identical to that of the base of the first bipolar transistor and having a doping density at least ten times greater than that of the base of the first bipolar transistor.

In some embodiments, the doping density in the base of the first bipolar transistor is less than or equal to $10^{18}$ cm$^{-3}$.

In other embodiments, the bases of the first and second bipolar transistors are formed in a semiconductor layer having a thickness less than or equal to fifteen nanometers.

In yet other embodiments, the integrated circuit comprises a second semiconductor ground plane arranged under the buried insulant layer, electrically biased, having a second type of doping and extending plumb with the base of the second bipolar transistor. In such embodiments, the first and second types of doping differ.

In yet embodiments, the first and second ground planes are in contact.

Among the embodiments are those in which the respective projections of the first and second ground planes on the buried insulant layer include the respective projections of the bases of the first and second bipolar transistors on the buried insulant layer.

In yet other embodiments, the integrated circuit comprises an electrically insulating element that separates the first and second ground planes and that is plumb with the junction between the base of the first bipolar transistor and the base of the second bipolar transistor.

In other embodiments, the first bipolar transistor lacks an electrode in contact with its base.

In yet other embodiments, the upper faces of the bases and of the emitters of the first and second bipolar transistors are flush.

In some embodiments, the integrated circuit furthermore comprises an FDSOI transistor formed on the buried insulant layer and a semiconductor ground plane arranged under the buried insulant layer plumb with the FDSOI transistor.

In another aspect, the invention features a process for fabricating an integrated circuit comprising a device for protecting against electrostatic discharges. Such a process includes the implantation of a first type of doping in a semiconductor substrate arranged under a buried insulant layer, the buried insulant layer having a thickness less than or equal to fifty nanometers, so as to form a first ground plane, the formation of first and second bipolar transistors including one npn transistor and one pnp transistor on the buried insulant layer, the base of the first transistor having the first type of doping and the respective bases of the first and second bipolar transistors being merged with the respective collectors of the second and first bipolar transistors, the base of the first bipolar transistor being formed plumb with the first ground plane, the doping of the base of the first transistor being performed during the implantation of the first type of doping for the formation of the first ground plane, the doping density at the end of the implantation in the first ground plane being at least ten times greater than that of the base of the first bipolar transistor.

In some practices, the method comprises forming an electrode electrically connected to the first ground plane and interconnecting the electrode with a bias circuit.

In other practices, the doping density in the base of the first transistor after having formed the interconnect with the bias circuit is less than or equal to $10^{18}$ cm$^{-3}$.

In yet other practices, the first and second bipolar transistors are formed in a semiconductor layer arranged on the buried insulant layer, and the process includes implanting dopant in the semiconductor layer, and doing so subsequent to the implantation for the formation of the first ground plane, the base of the first bipolar transistor being masked during each of these subsequent implanting steps.

In yet another practice, the fabrication process lacks the step of forming an electrode in contact with the base of the first bipolar transistor.

Other features and advantages of the invention will become clearly apparent from the description given hereinafter, for information purposes and in no way limiting, with reference to the appended drawings.

DETAILED DESCRIPTION

The invention proposes an integrated circuit equipped with a device for protecting against electrostatic discharges. The protection device comprises first and second bipolar transistors formed on a buried insulant layer of UTBOX type, the thickness of which is less than or equal to fifty nanometers. The transistors are configured for selectively conducting a discharge current between two electrodes of the protection device. The base and the collector of the first bipolar transistor are merged with the collector and the base of the second bipolar transistor respectively. These bipolar transistors are configured for selectively conducting a discharge current between two electrodes of the protection device.

A first semiconductor ground plane, also commonly called a "back gate," is arranged under the buried insulant layer. The first ground plane, which is electrically biased, is arranged plumb with the base of the first bipolar transistor. Its doping type is identical to that of the base. However, its doping density is at least ten times that of the first bipolar transistor's. In some embodiments, it is advantageously at least fifty times greater.

Such a device for protecting against electrostatic discharges makes it possible to dispense with an optimization of the base of one of the bipolar transistors, due to the electrostatic control of this base by the first ground plane. Such a protection device furthermore makes it possible to use a relatively low bias potential of the first ground plane to produce this electrostatic control.

It turns out that such a device for protecting against electrostatic discharges has a very small leakage current, even using the same bias level(s) of the ground planes as for the powering of the other circuits of the integrated circuit. Moreover, such a device for protecting against electrostatic discharges has a small on-resistance and a high maximum discharge current, and without requiring any complex control circuit. Such a device for protecting against electrostatic discharges can also be produced without involving excessively complex interconnects. With an appropriate fabrication process, it is thus possible to reduce the number of photolithographic masks required, by producing the base of the first bipolar transistor during the implantation of the dopant of the first ground plane.

Figure 2:
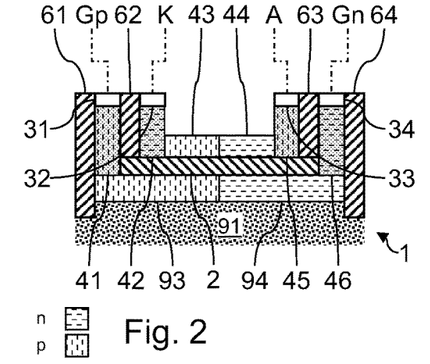
FIGS. 2 to 4 are transverse sectional views of different embodiments of a device for protecting against electrostatic discharges according to the invention.

FIG. 2 is a transverse sectional view of an integrated circuit 1, at the level of a device for protecting against electrostatic discharges in a first embodiment of the invention. The integrated circuit 1 includes other electronic components not illustrated here.

The protection device is formed plumb with a semiconductor substrate 91. In the illustrated example, the substrate 91 has p-doping. The protection device includes an npn bipolar transistor and a pnp bipolar transistor.

The npn transistor includes an emitter 42, a collector 44 and a base 43. The emitter 42 includes an n-doped semiconductor element, the collector 44 comprises an n-doped semiconductor element, and the base 43 comprises a p-doped semiconductor element. The pnp transistor includes an emitter 45. This emitter 45 includes a p-doped semiconductor element. The base of the pnp transistor is merged with the collector 44 of the npn transistor (it will therefore be denoted by the reference number 44), and the collector of the pnp transistor is merged with the base 43 of the npn transistor. This results in formation of a thyristor. The emitters 42, 45 advantageously exhibit N+-doping and P+-doping respectively. The emitters 42, 45 and the bases 43, 44 are formed in a semiconductor layer (here made of silicon) that is arranged on a buried insulant layer 2 and that has a thickness no greater than fifty nanometers. As used herein, "insulation" means electrical insulation.

The npn and pnp transistors are advantageously coplanar. As used herein, "coplanar" means that a plane can be defined passing through the emitters, bases, and collectors of these transistors, the plane being parallel with the buried insulant layer 2. The semiconductor layer typically has a thickness of less than or equal to fifteen nanometers, preferably equal to ten nanometers, and advantageously less than or equal to seven nanometers. Such a semiconductor layer thickness facilitates the electrostatic control of the bases 43, 44 by ground planes 93, 94. These thicknesses typically correspond to the thickness of a semiconductor layer on the buried insulant layer 2 before an epitaxial re-growth.

The emitters 42, 45 are respectively connected to electrodes K, A of the device for protecting against electrostatic discharges. Metallic contacts 32, 33 are, for this purpose, in contact with respective ones of the emitters 42, 45. The npn and pnp transistors are thus configured for selectively conducting a discharge current between the electrodes K, A, as detailed hereinafter.

The device for protecting against electrostatic discharges furthermore comprises a first semiconductor ground plane 93 and a second semiconductor ground plane 94. The first and second ground planes 93, 94 are arranged under the buried insulant layer 2. The first ground plane 93 extends until it is plumb with the base 43. The first ground plane 93 has a doping that is identical to that of the base 43, and is therefore p-doped. The second ground plane 94 extends until it is plumb with the base 44. The second ground plane 94 has a doping that is identical type to that of the base 44, and is therefore n-doped. The ground planes 93, 94 are electrically biased. The electrical bias of the ground plane 93 is applied by way of a region 41 implanted with p-doping (and advantageously with P+-doping) and by way of a metallic contact 31. A bias Gp is applied to the metallic contact 31 by way of a bias circuit not illustrated here. The electrical bias of the ground plane 94 is applied by way of a region 46 implanted with n-doping (and advantageously with N+-doping) and by way of a metallic contact 34. A bias Gn is applied to the metallic contact 34 by way of the bias circuit.

The device for protecting against electrostatic discharges advantageously includes, at its periphery, insulation trenches 61, 64 extending into the substrate 91 to some depth. The protection device furthermore advantageously includes an insulation trench 62 separating the emitter 42 from the implanted region 41. The insulation trench 62 extends into the buried insulant layer 2 to some depth. The protection device furthermore advantageously includes an insulation trench 63 separating the emitter 45 from the implanted region 46. The insulation trench 63 extends into the buried insulant layer 2 to some depth. In this illustrated embodiment, the insulation trenches 61, 64 extend more deeply than the insulation trenches 62, 63. The ground planes 93, 94 extend under the insulation trenches 62, 63 respectively, until they come into contact with the implanted regions 41, 46 respectively. The use of insulation trenches of different depths makes it possible to reduce the number of implanting steps, the bias of the ground planes 93, 94 by electrodes then requiring a smaller number of implanting steps.

Figure 5:
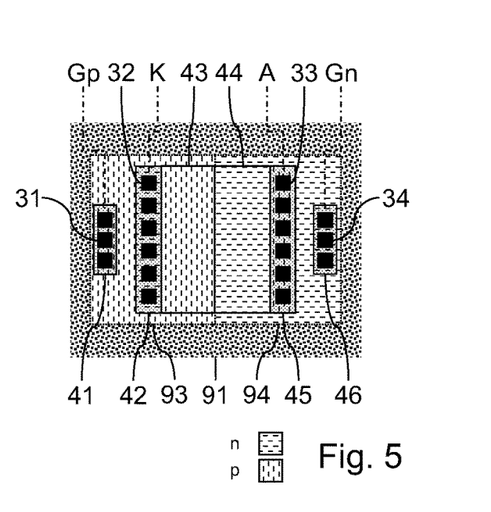
FIG. 5 is a schematic top view of the protection device in FIGS. 2 and 3.

FIG. 5 is a top view of the device for protecting against electrostatic discharges. Out of a concern for legibility, the insulation trenches 61-64 are not illustrated.

The doping density of the bases 43, 44 is at least ten times lower than the doping density of the ground planes 93, 94 respectively. Such doping can be obtained during the respective implantations of the ground planes 93, 94. Thus, during an implantation of a ground plane, with a maximum implantation depth arranged under the buried insulant layer 2, the density of doping of the same type in the semiconductor arranged on the buried insulant layer 2 is sufficient to form a base of a bipolar transistor. The lower the residual doping of the bases 43, 44 at the end of this implantation, the more voltage levels of low bias can be applied to the ground planes 93, 94. The doping of the bases 43, 44 typically has a density of less than $10^{18}$ cm$^{-3}$, and preferably of less than $5 \cdot 10^{17}$ cm$^{-3}$. To increase the influence of the electrostatic control of a ground plane on the base arranged plumb with it, the buried insulant layer advantageously has a thickness less than or equal to twenty-five nanometers, or even less than or equal to fifteen nanometers.

In this variant, the upper face of the bases 43, 44 is recessed with respect to the upper face of the emitters 42, 45. The formation of the emitters 42, 45 can, for example, be continued during an epitaxial re-growth phase to form emitters 42, 45 that are higher than the bases 43, 44.

Figure 6:
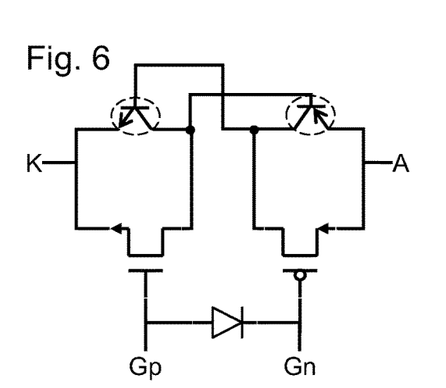
FIG. 6 is an electric circuit diagram equivalent to the protection device of FIGS. 2 to 4.

FIG. 6 is an approximation of the electrical circuit diagram equivalent to the device for protecting against electrostatic discharges of the first embodiment.

The respective biases applied to the ground planes 93, 94 make it possible to ensure electrostatic control of the bases 43, 44. This electrostatic control makes it possible, on the one hand, to reduce the leakage current when the protection device is not activated and also to modulate the respective triggering voltages of the npn and pnp transistors in the event of an electrostatic discharge, in particular in the absence of electrodes driving one or both of the bases 43, 44.

In a first operating mode corresponding to the mode of protection against electrostatic discharges, the bias circuit can apply a voltage Gnd to the ground plane 93 and to the ground plane 94, particularly when the doping of the bases 43, 44 is less than $10^{18}$ cm$^{-3}$. The triggering of the npn and pnp transistors is then not blocked to allow triggering in the presence of an electrostatic discharge. It is then possible to adjust the triggering threshold voltage by modifying the amplitude of a value $V_p$ and by applying $-V_p$ to the ground plane 93 and $+V_p$ to the ground plane 94. The higher the value of $V_p$, the more the triggering voltage of the npn and pnp transistors is raised. Because of the electrostatic control made possible by the ground planes 93, 94, the triggering voltage can be fixed using a low value of $V_p$, typically less than or equal to a voltage $V_{dd}$ powering the logic circuits or the memory circuits of the integrated circuit 1. It is also possible to apply a voltage Gnd to the ground plane 93 and a voltage $+V_p$ to the ground plane 94. It is also possible to apply a negative voltage $V_{p1}$ to the ground plane 93 and a positive voltage $V_{p2}$ to the ground plane 94, with different amplitudes for $V_{p1}$ and $V_{p2}$. The behavior of the protection device in the event of the appearance of an electrostatic discharge can therefore be easily adjusted.

In a second operating mode corresponding to the normal operating mode of the integrated circuit, the bias circuit can apply the voltage $-V_{dd}$ to the ground plane 93 and the voltage $V_{dd}$ to the ground plane 94, $V_{dd}$ being, for example, equal to one volt. Thus, despite the very weak doping of the bases 43, 44, a very low leakage current passes through them during normal operation of the integrated circuit 1. The doping of the majority carriers in the bases 43, 44 can, however, be defined as being high enough (for example close to $10^{18}$ cm$^{-3}$) to reduce the leakage current passing through them with even lower bias levels of the ground planes.

Figure 3:
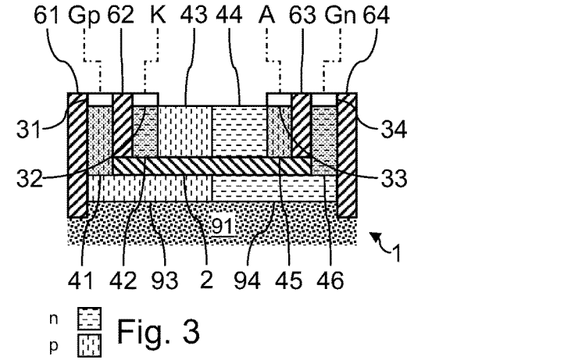

FIG. 3 is a transverse sectional view of a second variant of a device for protecting against electrostatic discharges of the first embodiment. This variant reproduces all the features of the first variant, the only difference being that the upper faces of the bases 43, 44 are flush with the upper faces of the emitters 42, 45. The formation of the bases 43, 44 and the emitters 42, 45 can for example be continued in one and the same epitaxial re-growth phase. Such a variant makes it possible to reduce as much as possible the conduction resistance through the bases 43, 44 and thus to increase the maximum intensity of a short-circuit in the event of an electrostatic discharge. The thickness of the bases 43, 44 resulting from epitaxial re-growth is advantageously less than or equal to twenty-five nanometers, and preferably less than or equal to twenty-two nanometers, in order to preserve optimal electrostatic control of the bases 43, 44 by the ground planes 93, 94.

Advantageously, an annealing step makes it possible to diffuse the dopants of each of the bases 43, 44 in their upper part obtained by epitaxy.

Figure 4:
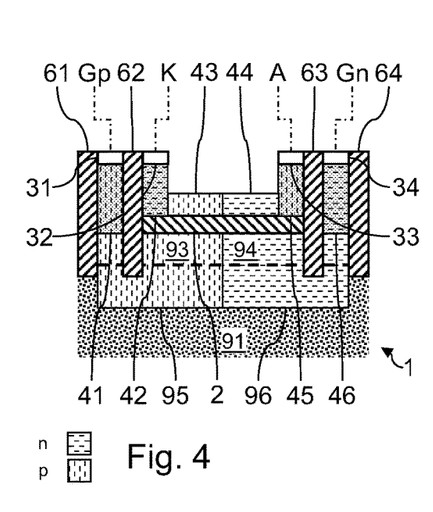

FIG. 4 is a transverse sectional view of a third embodiment of a device for protecting against electrostatic discharges of the first embodiment. This embodiment reproduces all the features of the first embodiment, the insulation trenches 62, 63 extending more deeply than the ground planes 93, 94, to the same depth as the insulation trenches 61, 64. In this embodiment, a well 95 is furthermore formed in the substrate 91 plumb with the ground plane 93. The well 95 extends under the insulation trench 62. The well 95 forms a p-doped semiconductor element linking the ground plane 93 to the implanted region 41. Another well 96 is furthermore formed in the substrate 91 plumb with the ground plane 94. This well 96 extends under the insulation trench 63 and forms an n-doped semiconductor element linking the ground plane 94 to the implanted region 46.

According to the first embodiment, the ground planes 93, 94 are in contact. To avoid a forward conduction of the diode formed between the ground planes 93, 94, the bias voltage Gp is at most equal to the bias voltage Gn. According to this first embodiment, the ground planes 93, 94 have respective projections (along the normal to the buried insulant layer) onto the buried insulant layer 2 which include the respective projections of the bases 43, 44 onto this buried insulant layer. In this way the electrostatic control of the ground planes 93, 94 is maximized on the bases 43, 44.

In the various illustrated variants of the first embodiment, the bases 43, 44 are without metallic contact or electrode contact.

Advantageously, the dopant concentration of the emitters 42, 45 is at least equal to $10^{20}$ cm$^{-3}$, preferably, at least equal to $5 \cdot 10^{20}$ cm$^{-3}$, and advantageously at least equal to $10^{21}$ cm$^{-3}$. Advantageously, the dopant concentration of the bases 43, 44 is between $5 \cdot 10^{16}$ cm$^{-3}$ and $5 \cdot 10^{17}$ cm$^{-3}$.

The other electronic components of the integrated circuit 1 can, for example, comprise transistors of FDSOI type arranged on the same buried insulant layer 2 as the protection device. These FDSOI transistors can be arranged plumb with the respective biased ground planes arranged under the buried insulant layer 2. In this technology, the doping of the transistor channel is almost zero (typically of $10^{15}$ cm$^{-3}$).

FIGS. 18 to 25 are transverse sectional views of an integrated circuit 1 according to another embodiment and during different steps of an example of a fabrication process.

Figure 18:
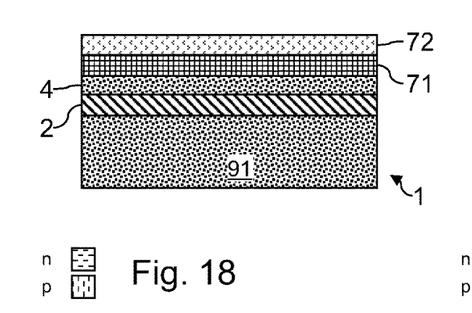
FIGS. 18 to 25 are transverse sectional views of an integrated circuit according to the third variant of the first embodiment of the invention, during various steps of an example of a fabrication process.

In FIG. 18, there is provided a buried insulant layer 2 arranged on a semiconductor substrate 91, typically made of silicon. A semiconductor layer 4, typically a slender layer of silicon having a thickness of less than or equal to ten nanometers, or even less than or equal to seven nanometers, is arranged on the buried insulant layer 2. A hard oxide mask 71 is typically formed on the layer 4. A nitride layer 72 is typically formed on the hard mask 71.

Figure 19:
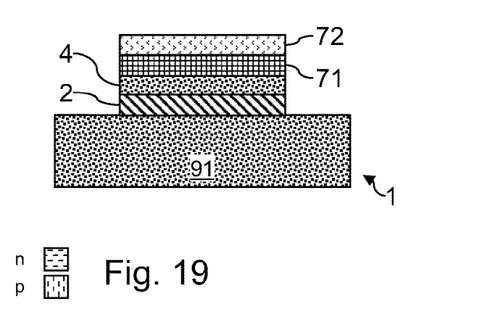

In FIG. 19, the integrated circuit 1 is shaped by photolithography in such a way as to keep the nitride 72, the hard mask 71, the layer 4 and the insulating layer 2 in the region in which one desires to form the npn and pnp transistors of the protection device. The layers of nitride 72 and of hard mask 71 are removed, notably in the regions where one wishes to form transistors of Bulk type by removing the buried insulant layer 2.

Figure 20:
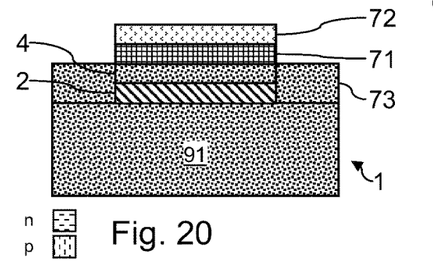

In FIG. 20, an epitaxy is advantageously carried out for the possible bulk regions of the integrated circuit 1. The epitaxy is, for example, produced to form a semiconductor silicon layer 73 flush with the layer 4.

Figure 21:
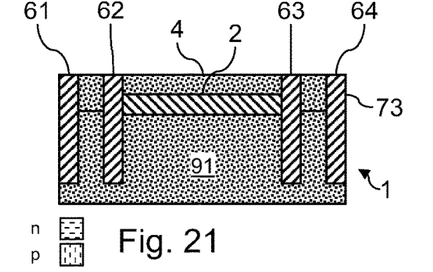

In FIG. 21, the hard mask 71 and the nitride layer 72 are removed. Insulation trenches 62, 63 are formed and extend into the substrate 91 to the periphery of the layer 4. Insulation trenches 61, 64 are formed and extend into the substrate 91. The insulation trenches 61, 64 in this embodiment have the same depth as the insulation trenches 62, 63. A semiconductor element extends between the insulation trenches 61, 62 up to the substrate 91. A semiconductor element extends between the insulation trenches 63, 64 up to the substrate 91.

In a variant of the sequence of steps 18 to 21, one may proceed as follows:

There is provided a buried insulant layer 2 arranged on a semiconductor substrate 91. A semiconductor layer 4 is arranged on the buried insulant layer 2.

Insulation trenches 62, 63 are formed and extend into the substrate 91 to the periphery of the layer 4. Insulation trenches 61, 64 are formed and extend into the substrate 91. The insulation trenches 61, 64 in this embodiment have the same depth as insulation trenches 62, 63. A semiconductor element extends between the insulation trenches 61, 62 up to the substrate 91. A semiconductor element extends between the insulation trenches 63, 64 up to the substrate 91.

A hard oxide mask 71 is then formed on the layer 4. A nitride layer 72 is then formed on the hard mask 71.

The integrated circuit 1 is then shaped by photolithography in such a way as to keep the nitride 72, the hard mask 71, the layer 4 and the insulant layer 2 in the region in which one desires to form the npn and pnp transistors of the protection device. The layers of nitride 72 and of hard mask 71 are removed notably in the regions where one wishes to form transistors of Bulk type by removing the buried insulant layer 2.

Optionally, an epitaxy is performed for any possible bulk regions of the integrated circuit 1. The epitaxy is for example performed to form a semiconductor silicon layer 73 flush with the layer 4.

Figure 22:
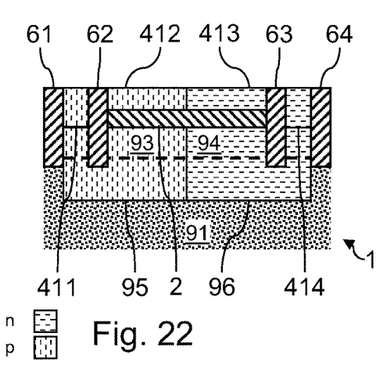

In FIG. 22, the implantation of a p-doped ground plane 93 has been performed under the buried insulant layer 2 on the one hand, and the implantation of an n-doped ground plane 94 has been performed under the buried insulant layer 2. The implantation of the ground plane 93 is typically performed with a dose of between $10^{12}$ cm$^{-2}$ and $10^{14}$ cm$^{-2}$ of indium, and an energy between 110 and 180 keV. The implantation of the ground plane 94 is typically performed with a dose between $10^{12}$ cm$^{-2}$ and $10^{14}$ cm$^{-2}$ of arsenic, and an energy between 90 and 150 keV. The implantation energies are of course adjusted as a function of the thickness of the layer 2 and of the film 4.

Moreover, a p-doped well 95 has been implanted under the ground plane 93 and extends under the insulation trench 62 into the semiconductor element arranged between the insulation trenches 61, 62. An n-doped well 96 has been implanted under the ground plane 94 and extends under the insulation trench 63 into the semiconductor element arranged between the insulation trenches 63, 64.

Although the implantation of the ground plane 93 is configured to exhibit a maximum density of implantation under the buried insulant layer 2 and in this ground plane 93, this implantation also leads to p-doping in the layer 4 plumb with the ground plane 93 (region 412) and in the upper part of the semiconductor element present between the insulation trenches 61, 62.

In the same way, although the implantation of the ground plane 94 is configured to have a maximum density of implantation under the buried insulant layer 2 and in this ground plane 94, this implantation also leads to n-doping in the layer 4 plumb with the ground plane 94 (region 413) and in the upper part of the semiconductor element present between the insulation trenches 63, 64.

Figure 23:
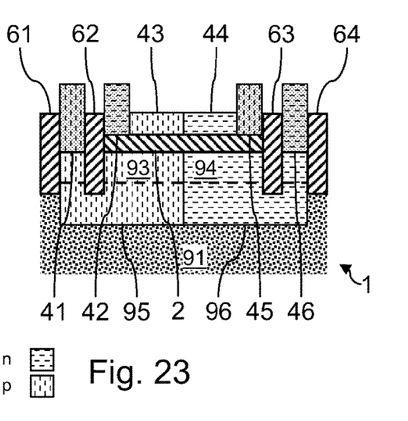

In FIG. 23, an epitaxial re-growth has been performed to increase the thickness of silicon on the semiconductor element present between the insulation trenches 61, 62, on the semiconductor element present between the insulation trenches 63, 64, on a part of the region 412 in contact with the trench 62, and on a part of the region 413 in contact with the trench 63. The regions on which one does not wish to perform epitaxy are typically protected by a hard mask (not illustrated). An implanted region 41 is formed by P$^+$-doping, the emitter 42 is formed by N$^+$-doping, the emitter 45 is formed by P$^+$-doping and the implanted region 46 is formed by N$^+$-doping.

At the end of the steps illustrated in FIG. 23, there is thus provided: a base 43 having the same type of doping as the ground plane 93, but with a doping density at least ten times smaller; and a base 44 having the same type of doping as the ground plane 94 and with a doping density at least ten times smaller.

In this way the structure of the npn and pnp bipolar transistors and of the corresponding thyristor is provided. For the remainder of the process, the doping of at least one of the bases formed during the implantation of one of the ground planes is retained. The doping of at least one of the two bases is therefore performed during the implantation of its ground plane. The residual doping of this base at the end of the implantation of its ground plane typically has a density of less than $10^{18}$ cm$^{-3}$, preferably of less than $5 \cdot 10^{17}$ cm$^{-3}$. Thus, at least one of the two bases is not subject to an implantation, by maintaining for example at least one of these two bases masked in any subsequent implantation step.

Figure 25:
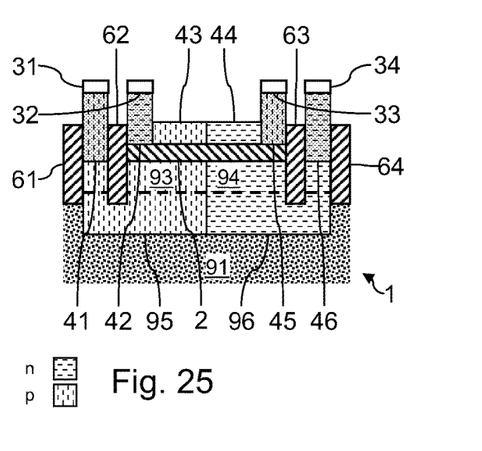

In FIG. 25, starting from the structure obtained in FIG. 23: a protection mask has been defined by defining the sites of the metallic bias contacts, a siliconization has been carried out, metal has been deposited to form metallic contacts 31 to 34 respectively on the implanted region 41, the emitter 42, the emitter 45 and the implanted region 46, and the protective mask has been removed.

In subsequent steps, interconnects are produced with the metallic contacts 31-34. In some examples, the metallic contacts 31, 34 are connected to a bias circuit. At this stage, the doping in the bases 43, 44 still corresponds to the doping at the end of the implantation of the ground planes 93, 94.

It will be noted that the advantages of an integrated circuit 1 obtained using such a fabrication process did not necessarily complicate the fabrication process. Indeed, such a fabrication process makes it possible to use one and the same mask for the implantation of dopants in one base and in one ground plane.

Figure 24:
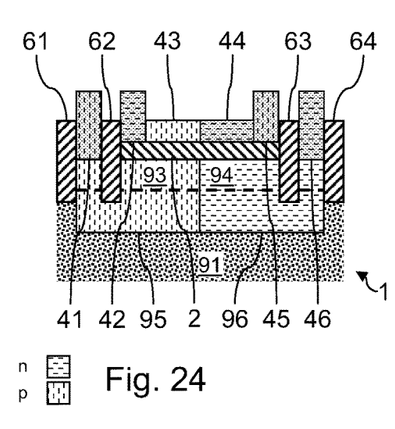

In FIG. 24, a variant is illustrated in which the base 44 of the structure obtained in FIG. 23 is subject to an additional implantation of LDD type (lowly doped drain, for a doping typically comprised between $10^{18}$ cm$^{-3}$ and $10^{19}$ cm$^{-3}$).

Figure 7:
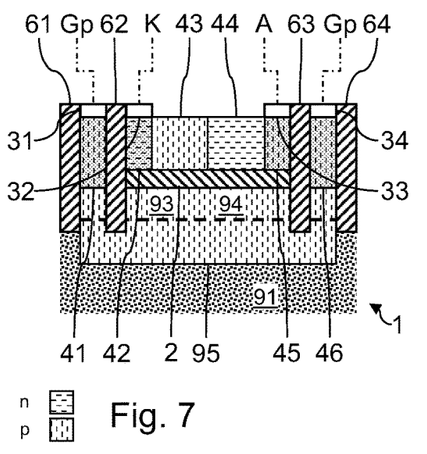
FIGS. 7 to 10 are transverse sectional views of different variants of a second embodiment of a device for protecting against electrostatic discharges according to the invention.

FIG. 7 is a transverse sectional view of an integrated circuit 1 at the level of a device for protecting against electrostatic discharges according to a first variant of a second embodiment of the invention. The integrated circuit 1 includes other electronic components not illustrated here.

This embodiment differs from those discussed earlier by having the ground planes 93, 94 be merged into one p-doped semiconductor element extending under the bases 43, 44 and under the emitters 42, 45; and by having the wells 95, 96 be replaced by one continuous p-doped well 95 extending under the ground planes 93, 94 and under the insulation trenches 62, 63 into the semiconductor elements arranged between the insulation trenches 61, 62 and between the insulation trenches 63, 64 respectively.

The doping density of the base 43 is at least ten times smaller than the doping density of the ground plane 93. The doping density of the base 44 can also be at least ten times smaller than the doping density of the ground plane 94. The doping of the base 43 being of the same type as that of the ground plane 93, its doping can be obtained during the implantation of the ground plane 93. Thus, during the implantation of the ground plane 93, with a maximum depth of implantation arranged under the buried insulant layer 2, the doping density of the same type in the semiconductor arranged under the buried insulant layer 2 is sufficient to form the base 43.

The doping of the base 44 being of an opposite type to that of the ground plane 94, the base 44 is subject to an n-doped implantation after the implantation of the ground planes 93, 94. The doping of the base 44 can typically be doping of LDD type. The doping density of the base 44 is typically greater than the doping density of the base 43.

The second embodiment makes it possible to produce the ground planes 93, 94 during one and the same implantation step. Moreover, the fabrication process and the control of the protection device are simplified, since one and the same bias voltage is applied to the ground planes 93, 94, preferably with the same metallic contact.

In this embodiment, the electrostatic control of the base 43 by the ground plane 93 is prevalent with respect to the electrostatic control of the base 44 by the ground plane 94.

Figure 8:
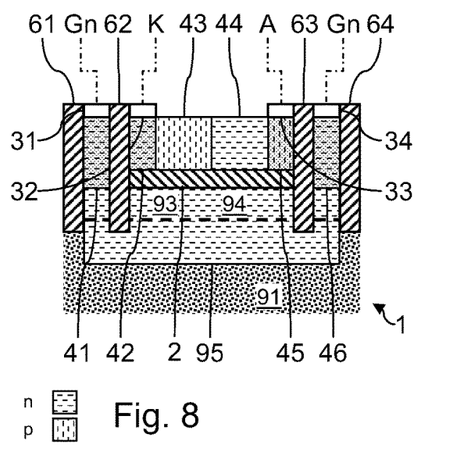

FIG. 8 is a transverse sectional view of another embodiment of the device for protecting against electrostatic discharges of the second embodiment. This embodiment reproduces all the features of the first variant, the main differences being that: the ground planes 93, 94 are merged into one n-doped semiconductor element extending under the bases 43, 44 and under the emitters 42, 45; and the well 95 is replaced by one continuous n-doped well 95 extending under the ground planes 93, 94 and under the insulation trenches 62, 63 into the semiconductor elements arranged between the insulation trenches 61, 62 and between the insulation trenches 63, 64 respectively.

The doping density of the base 44 is at least ten times smaller than that of the ground plane 94. The doping density of the base 43 can also be at least ten times smaller than the doping density of the ground plane 93. Since the base's doping is the same as that of the ground plane 94, the base 44 can be doped during the implantation of the ground plane 94. Thus, during the implantation of the ground plane 94, with a maximum depth of implantation arranged under the buried insulant layer 2, the doping density of the same type in the semiconductor arranged on the buried insulant layer 2 is sufficient to form the base 44.

The doping of the base 43 being of an opposite type to that of the ground plane 93, the base 43 is subject to a p-doped implantation after the implantation of the ground planes 93, 94. The doping of the base 43 can typically be doping of LDD type. The doping density of the base 43 is then typically greater than that of the base 44.

In this variant of the second embodiment, the electrostatic control of the base 44 by the ground plane 94 is prevalent with respect to the electrostatic control of the base 43 by the ground plane 93.

Figure 9:
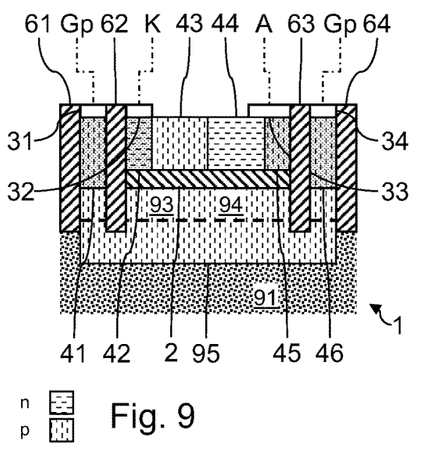

FIG. 9 is a transverse sectional view of another embodiment of the device for protecting against electrostatic discharges of the second embodiment. This embodiment reproduces all the features of the first embodiment, the only difference being that the metallic contact 33 extends until it is plumb with the base 44, in contact with this base 44. The base 43 is devoid of metallic contacts. In this embodiment, the control of the base 44 is improved, the gain of the pnp transistor is modified (downwards), and all of this is achieved without increasing the bulk of the integrated circuit 1 or increasing the complexity of its fabrication process.

Whatever the form of the metallic contact 33, it can also be envisaged that the metallic contact 32 extends until it is plumb with the base 43 and in contact with this base 43.

Figure 10:
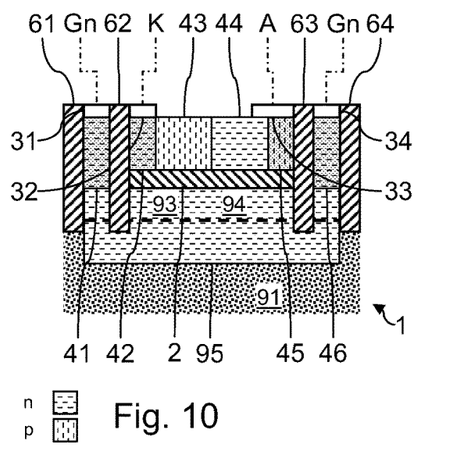

FIG. 10 is a transverse sectional view of a fourth variant of the device for protecting against electrostatic discharges of the second embodiment. This variant reproduces all the features of the third variant, the only difference being that the metallic contact 33 extends until it is plumb with the base 44, in contact with this base 44. As in the third variant of the first embodiment, the base 43 is devoid of metallic contacts. In this variant, the control of the base 44 is improved, the gain of the pnp transistor is modified, and this without increasing the bulk of the integrated circuit 1 or increasing the complexity of its fabrication process.

Whatever the form of the metallic contact 33, it can also be envisaged that the metallic contact 32 extends until it is plumb with the base 43, in contact with this base 43.

Other variants can also be provided on the basis of the first and second variants of the second embodiment. Starting from the first and second variants, provision can be made for the metallic contact 32 to extend until it is plumb with the base 43, in contact with this base 43. The base 44 is then devoid of metallic contacts.

Figure 11:
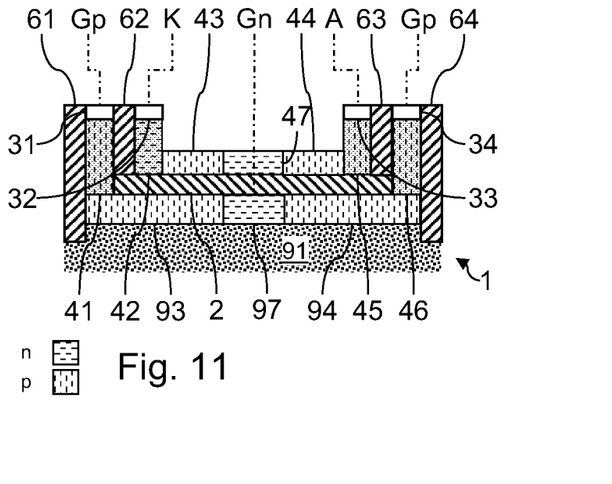
FIG. 11 is a transverse sectional view of a first variant of a third embodiment of a device for protecting against electrostatic discharges according to the invention.

FIG. 11 is a transverse sectional view of a first variant of a device for protecting against electrostatic discharges according to a third embodiment. The third embodiment is intended to form a TRIAC (for Triode Alternating Current) in order to protect the integrated circuit whatever the direction of flow of the electrostatic discharge. In this way, two-way protection of the integrated circuit 1 is obtained. The integrated circuit 1 includes other electronic components not illustrated here.

The protection device is formed plumb with a semiconductor substrate 91. This substrate 91 is p-doped for example. The protection device includes a bipolar transistor of npn type and a bipolar transistor of pnp type to form a TRIAC.

The npn transistor includes an emitter 42, a collector 47 and a base 43. The emitter 42 includes an n-doped semiconductor element. The collector 47 comprises an n-doped semiconductor element, and the base 43 comprises a p-doped semiconductor element. The pnp transistor includes an emitter. This emitter includes a first p-doped semiconductor element 45 and a second p-doped semiconductor element 44. The base of the pnp transistor is merged with the collector 47 of the npn transistor (it will therefore be denoted by the reference number 47 hereinafter), and the collector of the pnp transistor is merged with the base 43 of the npn transistor. The emitter 42 and the first semiconductor element 45 advantageously exhibit respective $N^+$-doping and $P^+$-doping. The emitters 42, 44/45 and the bases 43, 47 are formed in a semiconductor layer (here made of silicon) arranged on a buried insulant layer 2 having a thickness less than or equal to fifty nanometers. The npn and pnp transistors are advantageously coplanar. The semiconductor layer typically has a thickness less than or equal to fifteen nanometers, preferably less than ten nanometers, and advantageously less than or equal to seven nanometers. Such a semiconductor layer thickness facilitates the electrostatic control of the bases 43, 47 by ground planes 93, 97. These thicknesses typically correspond to the thickness of a semiconductor layer on the buried insulant layer 2 before an epitaxial re-growth.

The emitters of the npn and pnp transistors are respectively connected to electrodes K and A of the device for protecting against electrostatic discharges. Metallic contacts 32, 33 are for this purpose in contact with the emitters of the npn and pnp transistors respectively. The npn and pnp transistors are thus configured to selectively conduct a discharge current between the electrodes K and A.

The device for protecting against electrostatic discharges furthermore comprises a first semiconductor ground plane 93, a second semiconductor ground plane 94 and a third semiconductor ground plane 97.

The first, second and third ground planes 93, 94, 97 are arranged under the buried insulant layer 2. The first ground plane 93 extends until it is plumb with the base 43. The first ground plane 93 has identical doping to that of the base 43, therefore p-doping. The third ground plane 97 has identical doping to that of the base 47, therefore n-doping.

The second ground plane 94 extends plumb with the emitter including the semiconductor elements 44, 45. The second ground plane 94 has identical doping to that of these semiconductor elements 44, 45, therefore p-doping. The ground planes 93, 94, 97 are electrically biased. The electrical bias of the ground plane 93 is applied by way of a p-doped (and advantageously $P^+$-doped) implanted region 41 and by way of a metallic contact 31. A bias Gp is applied to the metallic contact 31 by way of a bias circuit not illustrated here. The electrical bias of the ground plane 94 is applied by way of a p-doped (and advantageously $P^+$-doped) implanted region 46 and by way of a metallic contact 34. The bias Gp is applied to the metallic contact 34. The electrical bias of the ground plane 97 is applied by way of a non-illustrated n-doped (and preferably $N^+$-doped) implanted region and by way of a metallic contact 35. A bias Gn is applied to the metallic contact 35 by way of the bias circuit.

This device for protecting against electrostatic discharges advantageously includes, on its periphery, insulation trenches 61, 64 extending into the substrate 91 by some depth. The protection device furthermore advantageously includes an insulation trench 62 separating the emitter 42 from the implanted region 41. The insulation trench 62 extends as deeply as the buried insulant layer 2. The protection device furthermore advantageously includes an insulation trench 63 separating the emitter of the pnp transistor from the implanted region 46. The insulation trench 63 extends as deeply as the buried insulant layer 2. In this variant, the insulation trenches 61, 64 extend more deeply than the insulation trenches 62, 63.

The ground planes 93, 94 extend under the insulation trenches 62, 63 respectively, until they come into contact with the implanted regions 41, 46 respectively. The ground plane 97 extends along another axis under a non-illustrated insulation trench until it comes into contact with an implanted region.

Figure 12:
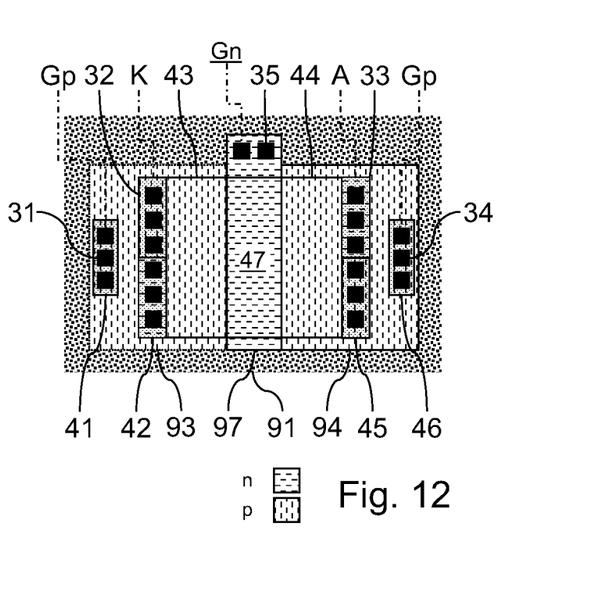
FIG. 12 is a top view of the device in FIG. 11.

FIG. 12 is a top view of the device for protecting against electrostatic discharges of FIG. 11. Out of a concern for legibility, the insulation trenches 61-64 have not been illustrated.

The doping density of the bases 43, 47 is at least ten times smaller than the doping density of the ground planes 93, 97 respectively. Such doping can be obtained during the respective implantations of the ground planes 93, 97. In the same way, the density of the second semiconductor element 44 is at least ten times smaller than the doping density of the ground plane 94.

Thus, during an implantation of a ground plane, with a maximum implantation depth arranged under the buried insulant layer 2, the density of doping of the same type in the semiconductor arranged on the buried insulant layer 2 is sufficient to form a base of a bipolar transistor. The lower the residual doping of the bases 43, 47 at the end of this implantation, the more low bias voltage levels can be applied to the ground planes 93, 97. The doping of the bases 43, 47 typically has a density of less than $10^{18}$ cm$^{-3}$, preferably of less than $5 \cdot 10^{17}$ cm$^{-3}$. To increase the influence of the electrostatic control of a ground plane on the base arranged plumb with it, the buried insulant layer advantageously has a thickness of less than or equal 25 nm, or even less than or equal to fifteen nanometers.

In this embodiment, the upper face of the bases 43, 47 and of the semiconductor element 44 are recessed relative to the upper face of the emitter 42 and of the semiconductor element 45. The formation of the emitter 42 and of the semiconductor element 45 can, for example, be continued in an epitaxial re-growth phase.

Figure 13:
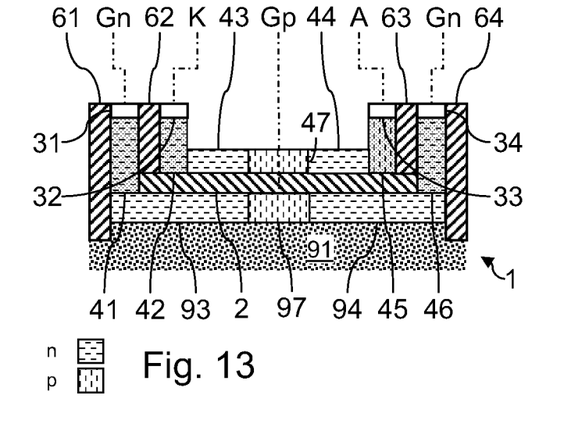
FIG. 13 is a transverse sectional view of a second variant of a third embodiment of a device for protecting against electrostatic discharges according to the invention.
Figure 14:
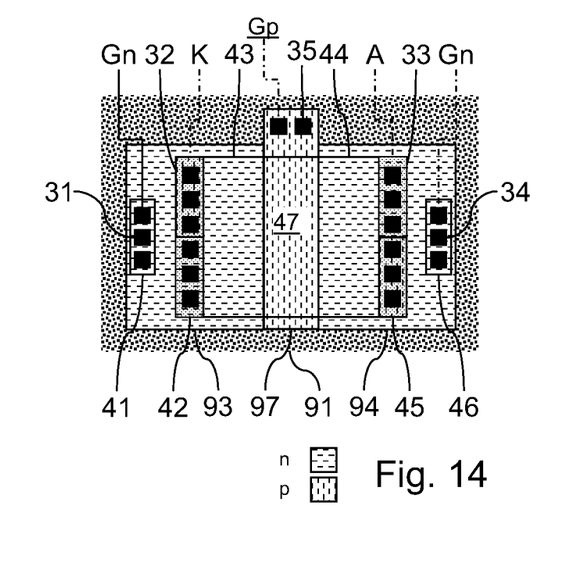
FIG. 14 is a top view of the device in FIG. 13.

FIG. 13 is a transverse sectional view of a second variant of a device for protecting against electrostatic discharges according to a third embodiment. FIG. 14 is a top view of the device for protecting against electrostatic discharges of FIG. 13. For the sake of legibility, the insulation trenches 61 to 64 have not been illustrated.

This variant reproduces all the features of the first variant, the main differences being that: the emitter of the npn transistor comprises a semiconductor element 42 and a semiconductor element 43; the semiconductor element 47 forms the base of the npn transistor; the semiconductor element 45 forms the emitter of the pnp transistor; the semiconductor element 44 forms the base of the pnp transistor; the doping of the implanted regions 41, 46, of the base 44, of the semiconductor elements 42, 43 and of the ground planes 93, 94 is n-type; the doping of the base 47, of the emitter 45 and of the ground plane 97 is p-type; a bias $V_{Gn}$ is applied to the ground plane 97; and a bias $V_{Gp}$ is applied to the ground planes 93, 94.

Figure 15:
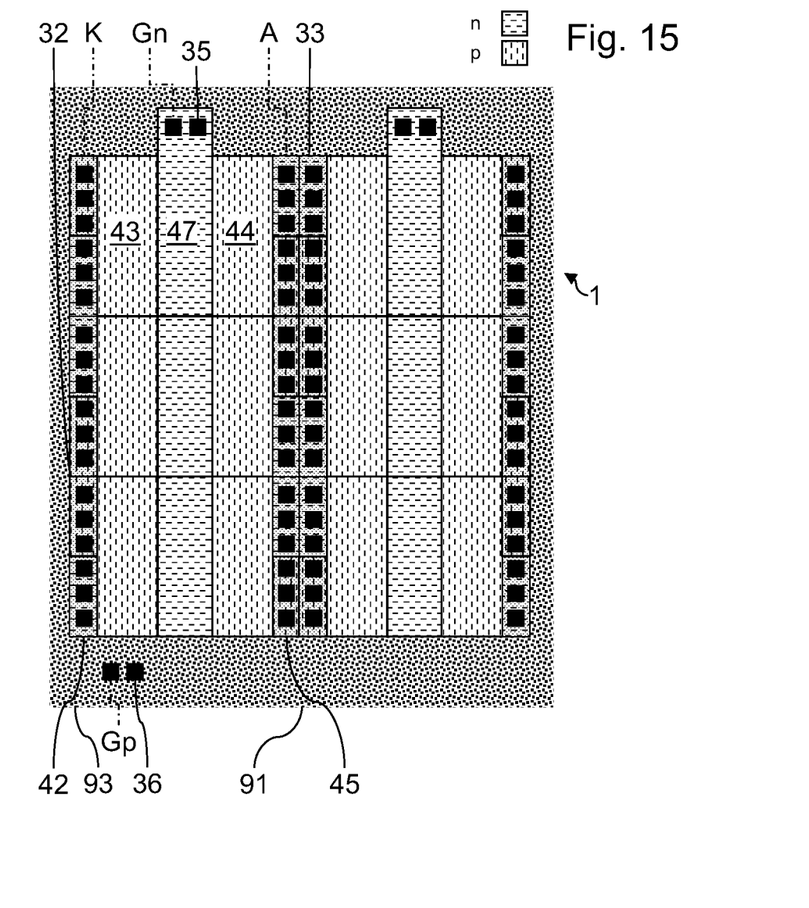
FIG. 15 is a top view of a set of devices according to FIG. 11 placed side by side in an integrated circuit.

FIG. 15 is a top view of a set of protection devices according to FIG. 11 placed side by side in an integrated circuit 1. This figure makes it possible to observe that the bias of the ground planes 97 by way of metallic contacts can be produced in a common manner for several devices for protecting against discharges, with a minimum of bulk.

Although not illustrated, it can also be envisaged that the insulation trenches 61 to 64 of the third embodiment exhibit one and the same depth. It can also be envisaged that the upper faces of the semiconductor elements 43, 44, 47 are flush with the upper faces of the emitters 42, 45. The doping of one of the semiconductor elements 43, 44, 47 can also be of LDD type.

Figure 16:
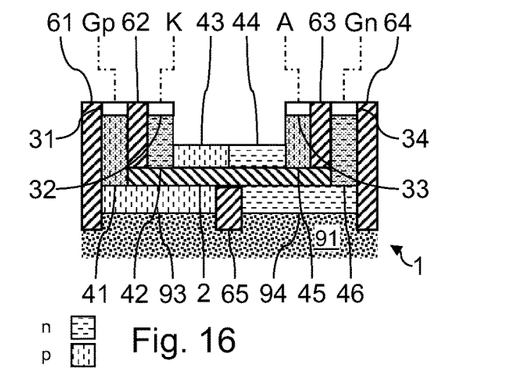
FIGS. 16 to 17 are transverse sectional views of different variants of a fourth embodiment of a device for protecting against electrostatic discharges according to the invention.

FIG. 16 is a transverse sectional view of an integrated circuit 1 at the level of a device for protecting against electrostatic discharges according to a first variant of a fourth embodiment of the invention. The integrated circuit 1 includes other electronic components not illustrated here.

This variant differs from the first variant of the first embodiment solely by the presence of an insulation element 65 extending between the buried insulant layer 2 and the substrate 91. The insulation element 65 is positioned plumb with the contact between the bases 43, 44. The insulation element 65 extends into the substrate 91 more deeply than the ground planes 93, 94. The element 65 extends here to the same depth as the insulation trenches 61, 64. The insulation element 65 electrically insulates the ground planes 93, 94 from each other. Such an insulation makes it possible to reduce leaks between the ground planes 93, 94 and also to reduce parasitic capacitances with the aim of improving performance at high frequencies. Moreover, it is possible to use a wider variety of bias potentials on the ground planes 93, 94.

In this embodiment, the projections of the ground planes 93, 94 on the layer 2 (along a normal to the layer 2) do not include the respective projections of the bases 43, 44 on this layer 2. However, a sufficient proportion of the ground planes 93, 94 remains plumb with the bases 43, 44 respectively, to guarantee electrostatic control of the latter. In particular, the ground planes 93, 94 extend plumb with the emitter 42/base 43 and emitter 45/base 44 contacts respectively.

Figure 17:
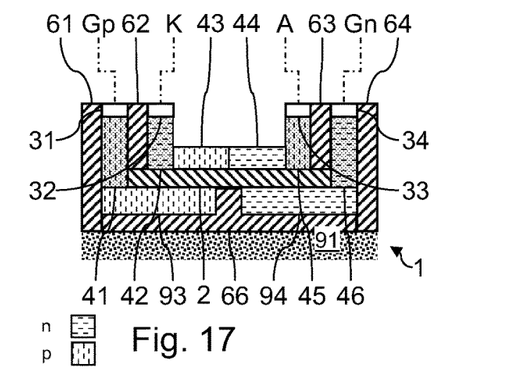

FIG. 17 is a transverse sectional view of an integrated circuit 1 at the level of a device for protecting against electrostatic discharges according to a second variant of the fourth embodiment of the invention. This variant differs from the first variant in that it furthermore comprises another buried insulant layer 66, arranged under the ground planes 93, 94 and extending between the insulation trenches 61, 64. The buried insulant layer 66 electrically insulates the ground planes 93, 94 from the substrate 91. The layer 66 also has a projecting part between the ground planes 93, 94 extending up to the buried insulant layer 2, so as to insulate the ground planes 93, 94 from each other. Due to the insulation with respect to the substrate 91, a bias voltage of the ground plane 93 greater than the bias voltage of the ground plane 94 is possible.

In some embodiments, the substrate 91 and the semiconductor layers are made of silicon. However other semiconductor materials can also be used.

By taking measurements, it has been possible to verify a very linear relationship between the bias voltage of a ground plane under a base and the triggering voltage of a device for protecting against electrostatic discharges according to the invention. It has also been possible to observe that a bias voltage of a ground plane having a normal logic level furthermore makes it possible to obtain a triggering voltage of the protection device greater than this logic level.

Figure 26:
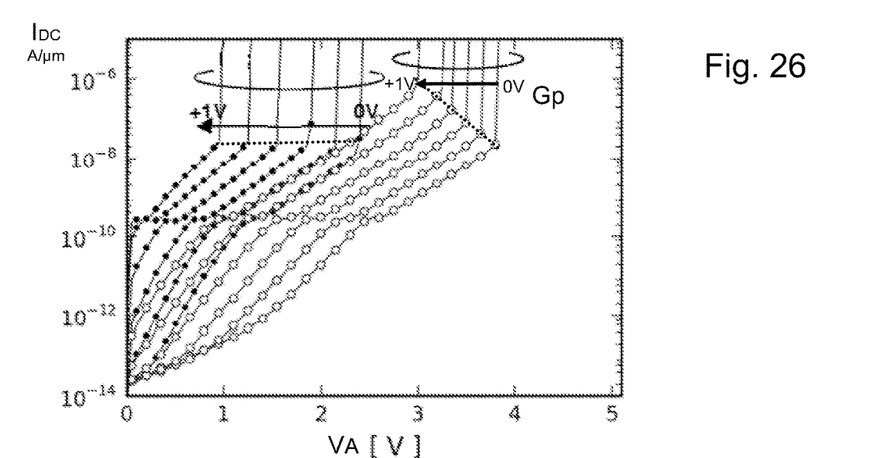
FIG. 26 illustrates diagrams of measurements of current density as a function of the anode voltage, for various ground plane bias voltages.

Measurements were also carried out with an integrated circuit corresponding to the first variant of the second embodiment, as well as with another variant of this second embodiment. FIG. 26 supplies diagrams illustrating the current density $I_A$ as a function of the anode voltage ($V_A$), for various bias voltages $V_{Gp}$ of the ground plane placed under the p-doped base. The diagrams of the left part of the figure correspond to the first variant of the second embodiment, with floating bases. The diagrams of the right part of the figure correspond to a declension of this first variant of the second embodiment in which the metallic cathode 32 in contact with the implanted region 42 projects until it comes into contact with the base 43.

This diagram confirms the great linearity between the bias voltage Gp and the triggering voltage $V_{t1}$ (the triggering voltage is deduced from the diagrams at the intersection of the latter and a dotted segment), whether this is for a positive or negative voltage Gp. It is furthermore noted that the control by a voltage Gp comprised between 0 and +1 V makes it possible to obtain a triggering voltage $V_{t1}$ between 1 and 3.9 V according to whether the base 43 is floating or short-circuited at the metallic cathode 32.

In the different detailed variants, the bases are not connected to a circuit for controlling the base currents.

The invention claimed is:

1. A manufacture comprising an integrated circuit comprising a protection device for protection of said integrated circuit against electrostatic discharge, said protection comprising, first and second electrodes, a buried insulant layer, a first bipolar transistor, a second bipolar transistor, and a first semiconductor ground plane, wherein said buried insulant layer has a thickness that is no greater than fifty nanometers, wherein said first and second bipolar transistors are arranged on said buried insulant layer, wherein one of said first and second bipolar transistors is an NPN transistor, wherein another of said first and second bipolar transistors is a PNP transistor, wherein a base of said first bipolar transistor merges with a collector of said second bipolar transistor, wherein a base of said second bipolar transistor merges with a collector of said first bipolar transistor, wherein said first and second bipolar transistors are configured for selectively conducting a discharge current between said first and second electrodes, wherein said first semiconductor ground plane is arranged under said buried insulant layer, wherein said first semiconductor ground plane is capable of being electrically biased, wherein said first semiconductor ground plane extends underneath said base of said first bipolar transistor, wherein said first semiconductor ground plane has a first type of doping, wherein said base of said first bipolar transistor has said first type of doping, and wherein said first semiconductor ground plane has a dopant density that is at least ten times greater than a dopant density of said base of said first bipolar transistor.

2. The manufacture of claim 1, wherein a dopant density in said base of said first bipolar transistor is no greater than $10^{18}$ cm$^{-3}$.

3. The manufacture of claim 1, further comprising a semiconductor layer, wherein said first and second bipolar transistors are formed in said semiconductor layer, and wherein said semiconductor layer is no greater that fifteen nanometers in thickness.

4. The manufacture of claim 1, further comprising a second semiconductor ground plane, wherein said second semiconductor group plane lies under said buried insulant layer, wherein said second semiconductor ground plane is configured to be electrically biased, wherein said second semiconductor ground plane has a second type of doping, wherein said second semiconductor ground plane extends underneath said base of said second bipolar transistor, and wherein said first type of doping differs from said second types of doping.

5. The manufacture of claim 4, wherein said first semiconductor ground plane contacts said second semiconductor ground plane.

6. The manufacture of claim 5, wherein there exists a first projection and a second projection, wherein said first projection is a projection of a third semiconductor ground plane onto said buried insulant layer, wherein said second projection is a projection of a third base onto said buried insulant layer, wherein said first projection is larger than said second projection, wherein said first projection comprises said second projection, wherein said third semiconductor ground plane is selected from the group consisting of said first semiconductor ground plane and said second semiconductor ground plane, and wherein said third base is selected from the group consisting of said first base and said second base.

7. The manufacture of claim 5, wherein there exists a first projection and a second projection, wherein said first projection is a projection of a third semiconductor ground plane onto said buried insulant layer, wherein said second projection is a projection of a third base onto said buried insulant layer, wherein said third semiconductor ground plane is selected from the group consisting of said first semiconductor ground plane and said second semiconductor ground plane, and wherein said third base is selected from the group consisting of said first base and said second base, and wherein at least a portion of said second projection is above said first projection.

8. The manufacture of claim 5, wherein respective projections of said first and second ground planes on said buried insulant layer include respective projections of said bases of the first and second bipolar transistors on said buried insulant layer.

9. The manufacture of claim 4, further comprising an electrically insulating element and a junction, wherein said junction is between said base of said first bipolar transistor and said base of said second bipolar transistor, wherein said electrically insulating element separates said first and second semiconductor ground planes, and wherein said electrically insulating element is underneath said junction.

10. The manufacture of claim 4, further comprising a semiconductor substrate, wherein said electrically insulating element comprises another buried insulant layer, and wherein said another buried insulant layer is between said semiconductor substrate and said first and second semiconductor ground planes.

11. The manufacture of claim 1, wherein one of said first and second electrodes contacts said base of said second bipolar transistor.

12. The manufacture of claim 1, wherein neither electrode contacts said base of said first bipolar transistor.

13. The manufacture of claim 1, further comprising a first upper face, a second upper face, a third upper face, and a fourth upper face, wherein said first upper face is an upper face of said base of said first bipolar transistor, wherein said second upper face is an upper face of said second bipolar transistor, wherein said third upper face is an upper face of an emitter of said first bipolar transistor, wherein said fourth upper face is an upper face of an emitter of said second bipolar transistor, and wherein said first upper face, said second upper face, said third upper face, and said fourth upper face are flush with each other.

14. A method comprising fabricating an integrated circuit, wherein fabricating said integrated circuit comprises forming a first semiconductor ground plane by implanting a first type of dopant into a semiconductor substrate that is arranged under a buried insulant layer, said buried insulant layer having a thickness less than or equal to 50 nm, forming first and second bipolar transistors on said buried insulant layer, wherein one of said first and second transistors is an NPN transistor and an other of said first and second transistors is a PNP transistor, wherein a base of said first transistor has said first type of dopant, wherein said base of said first transistor and a base of said second transistor merge with respective collectors of said second and first bipolar transistors, wherein said base of said first bipolar transistor is formed above said first semiconductor ground plane, wherein doping of said base of said first transistor is performed during implantation of said first type of dopant for formation of said first semiconductor ground plane, wherein a dopant density upon completion of said implantation in said first semiconductor ground plane is at least ten times greater than a dopant density of said base of said first bipolar transistor.

15. The method of claim 14, further comprising forming an electrode that is electrically connected to said first semiconductor ground plane and interconnecting said electrode with a bias circuit.

16. The method of claim 14, further comprising causing a dopant density in said base of said first transistor to be no greater than $10^{18}$ cm$^{-3}$ after forming said interconnect with said bias circuit.

17. The method of claim 15, wherein forming said electrode comprises forming said electrode such that said electrode is not in contact with said base of said first bipolar transistor.

18. The method of claim 14, wherein forming first and second bipolar transistors on said buried insulant layer comprises forming said first and second bipolar transistors in a semiconductor layer that is arranged on said buried insulant layer and, after implantation to form said first semiconductor ground plane, executing plural implanting steps, each of which includes masking said base of said first bipolar transistor.

* * * * *